US011468628B2

(12) United States Patent
Cole et al.

(10) Patent No.: US 11,468,628 B2
(45) Date of Patent: Oct. 11, 2022

(54) SUBMERSIBLE INSPECTION DEVICE AND VISION BASED MODELLING

(71) Applicant: HITACHI ENERGY SWITZERLAND AG, Baden (CH)

(72) Inventors: Gregory Cole, West Hartford, CT (US); William Eakins, Bloomfield, CT (US); Daniel Lasko, Bloomfield, CT (US); Harshang Shah, Bloomfield, CT (US); Thomas Fuhlbrigge, Ellington, CT (US); Carlos W. Morato, Avon, CT (US); Biao Zhang, West Hartford, CT (US); Luiz Cheim, St. Charles, MO (US); Poorvi Patel, Ballwin, MO (US); Harald Josef Staab, Manchester, CT (US); Saumya Sharma, Hartfod, CT (US)

(73) Assignee: Hitachi Energy Switzerland AG, Baden (CH)

( * ) Notice: Subject to any disclaimer, the term of this patent is extended or adjusted under 35 U.S.C. 154(b) by 665 days.

(21) Appl. No.: 15/835,178

(22) Filed: Dec. 7, 2017

(65) Prior Publication Data
US 2018/0158232 A1      Jun. 7, 2018

Related U.S. Application Data

(60) Provisional application No. 62/431,329, filed on Dec. 7, 2016.

(51) Int. Cl.
*G06T 15/20* (2011.01)
*G06T 17/20* (2006.01)
(Continued)

(52) U.S. Cl.
CPC ............ *G06T 15/205* (2013.01); *B63G 8/001* (2013.01); *G06T 7/593* (2017.01); *G06T 7/73* (2017.01);
(Continued)

(58) Field of Classification Search
CPC ......... G06T 15/205; G06T 7/97; G06T 17/20; G06T 7/55; B63G 8/001
See application file for complete search history.

(56) References Cited

U.S. PATENT DOCUMENTS 8,761,457 B1 * 6/2014 Seitz ..................... G06T 3/0093
382/113
2017/0171525 A1 * 6/2017 Koehle ................ H04N 13/204

FOREIGN PATENT DOCUMENTS

EP          2762279 A1 *  8/2014  ............... B63G 8/16

OTHER PUBLICATIONS

Collet, A., & Srinivasa, S. S. (May 2010). Efficient multi-view object recognition and full pose estimation. In 2010 IEEE International Conference on Robotics and Automation (pp. 2050-2055). IEEE. (Year: 2010).*

* cited by examiner

*Primary Examiner* — Bijan Mapar
(74) *Attorney, Agent, or Firm* — Sage Patent Group (57) ABSTRACT

A submersible vehicle which includes a plurality of cameras can be used to collect visual images of an object of interest submerged in a liquid environment, such as in a tank (e.g. transformer tank). In one form the submersible vehicle is remotely operated such as an ROV or an autonomous vehicle. Image information from the submersible along with inertial measurements in some embodiments is used with a vision based modelling system to form a model of an internal object of interest in the tank. The vision based modelling system can include a number of processes to form (Continued)

the model such as but not limited to tracking, sparse and dense reconstruction, model generation, and rectification.

19 Claims, 4 Drawing Sheets

(51) Int. Cl.
    *G06T 7/00*           (2017.01)
    *B63G 8/00*           (2006.01)
    *G06T 7/73*           (2017.01)
    *G06T 7/593*         (2017.01)
    *G06T 7/55*          (2017.01)
    *G06F 30/20*         (2020.01)

(52) U.S. Cl.
    CPC ................ *G06T 7/97* (2017.01); *G06T 17/20* (2013.01); *B63G 2008/005* (2013.01); *G06F 30/20* (2020.01); *G06T 7/55* (2017.01); *G06T 2200/08* (2013.01); *G06T 2207/10012* (2013.01)

SUBMERSIBLE INSPECTION DEVICE AND VISION BASED MODELLING

TECHNICAL FIELD

The present invention generally relates to submersible inspection devices, and more particularly, but not exclusively, to vision based modelling systems used with submersible inspection devices.

BACKGROUND

Providing the ability to inspect submerged objects and construct models of the objects remains an area of interest. Some existing systems have various shortcomings relative to certain applications. Accordingly, there remains a need for further contributions in this area of technology.

SUMMARY

One embodiment of the present invention is a unique submersible for inspection of an electrical transformer. Other embodiments include apparatuses, systems, devices, hardware, methods, and combinations for vision-based modeling using information from the submersible. Further embodiments, forms, features, aspects, benefits, and advantages of the present application shall become apparent from the description and figures provided herewith.

DETAILED DESCRIPTION OF THE ILLUSTRATIVE EMBODIMENTS

For the purposes of promoting an understanding of the principles of the invention, reference will now be made to the embodiments illustrated in the drawings and specific language will be used to describe the same. It will nevertheless be understood that no limitation of the scope of the invention is thereby intended. Any alterations and further modifications in the described embodiments, and any further applications of the principles of the invention as described herein are contemplated as would normally occur to one skilled in the art to which the invention relates.

Figure 1:
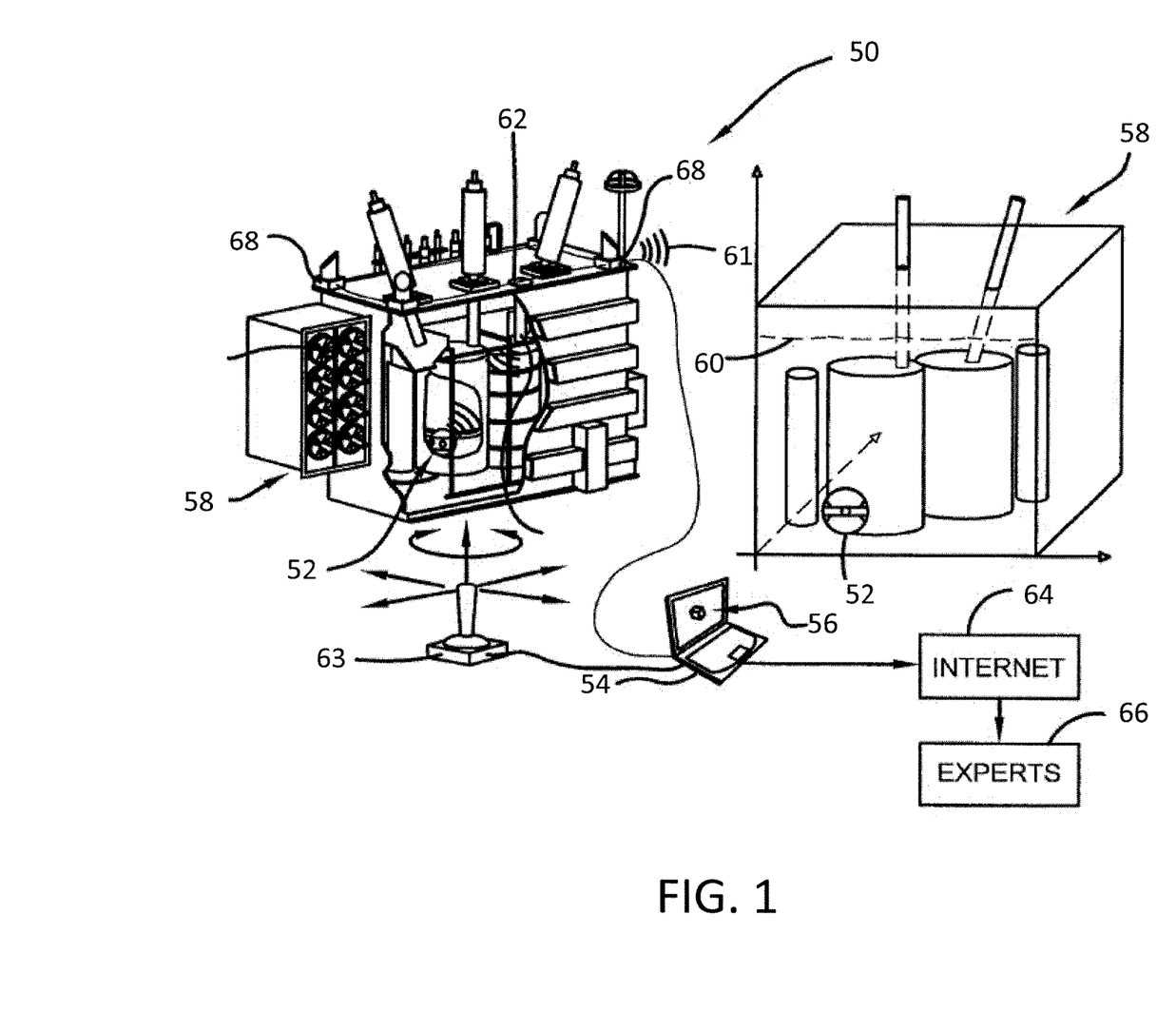
FIG. 1 depicts an embodiment of a submersible drone communicating with a base station.

With reference to FIG. 1, there is illustrated a system for in-situ inspection designated generally as 50. The system 50 generally includes an inspection device in the form of a submersible remotely operated vehicle (ROV) 52 which is wirelessly controlled from a control station which, in the illustrated embodiment, includes a computer 54 and a display 56. As used herein, the term "submersible" includes, but is not limited to, a vehicle capable of operation under the surface of a liquid body. Although much of the description that follows utilizes the term ROV for sake of brevity, it will be understood that the various embodiments described herein are not strictly limited to remotely operated vehicles, but can also be utilized with autonomous submersibles as well such as but not limited to those that are remotely triggered but are otherwise autonomous. For example, the inspection devices described herein can be static devices that observe and collect data whether remotely operated or in an autonomous configuration. Such a static device can be placed in its location as a result of operation of the ROV or autonomous device. Thus, embodiments of the device 52 are intended to cover a broad range of devices not simply limited to ROVs unless otherwise indicated to the contrary (as one non-limiting example, use of the term 'drone' is capable of covering ROV as well as autonomous devices 52 or static inspection drones useful for monitoring and/or inspection duties).

Of note in FIG. 1, the system 50 includes components generally on the left and bottom side of the figure, with the components on the upper right representing a schematic model of certain aspects of the system 50 (e.g. the tank in which the ROV 52 is operating) which will be understood by those of skill in the art. In many forms the submersible vehicles described herein are capable of operating in a container which maintains a fluid such as a pool or chemical storage tank, but in other forms can be a sealed container such as a tank. The liquid can take any variety of forms including water, but other liquid possibilities are also contemplated. By way of example, and not limitation, may be performed on/in portions of ship hulls, electrical interrupters, high voltage switch gears, nuclear reactors, fuel tanks, food processing equipment, floating roof storage system, chemical storage tank, or other apparatuses of similar nature.

The submersible ROV 52 shown in the illustrated embodiment is being used to inspect a tank for a transformer 58, but other applications are contemplated herein. Skilled artisans will appreciate that the inspection typically occurs only when the transformer 58 is offline or not in use. In many embodiments the transformer 58 utilizes its liquid as a cooling fluid 60 to maintain and disburse heat generated by the internal components during operation of the transformer. The cooling fluid 60 can be any liquid coolant contained within an electrical transformer, such as but not limited to a liquid organic polymer. Such liquid can therefore be transformer oil, such as but not limited to mineral oil. In other forms the transformer liquid can be pentaerythritol tetra fatty acid natural and synthetic esters. Silicone or fluorocarbon-based oils can also be used. In still other forms a vegetable-based formulation, such as but not limited to using coconut oil, may also be used. It may even be possible to use a nanofluid for the body of fluid in which the robotic vehicle is operating. In some embodiments, the fluid used in the transformer includes dielectric properties. Mixtures using any combination of the above liquids, or possibly other liquids such as polychlorinated biphenyls may also be possible.

As skilled artisans will appreciate, the transformer 58 is typically maintained in a sealed configuration so as to prevent contaminants or other matter from entering. As used herein, a "sealed configuration" of the tank allows for sealed conduits and/or ducts to be associated with the transformer's tank or housing to allow for connection to the electrical components and/or monitoring devices maintained in the tank. The tank is also provided with at least one opening to allow for the filling and/or draining of the cooling fluid. As shown in FIG. 1, a hole 62 can be an existing service hole, e.g. those used for filling the transformer oil and/or those used to enter a tank upon servicing by a technician. In general operation, the oil is inserted through any number of holes located in the top of the tank. Holes 62 may also be provided at the bottom of the tank to allow for the fluid to be drained. The holes 62 are provided with the appropriate plugs or caps. In some embodiments the hole 62 can be sized and structured such that the transformer tank top need not be unsealed completely or at all to introduce the submersible ROV 52. Accordingly, it will be appreciated that the size of the inspection device can be such that it can fit within a designated hole, whether the hole is the hole 62 depicted in the illustration or other types of access points discussed elsewhere herein and/or appreciated by those of skill in the art.

The ROV 52 is insertable into the transformer 58 or sealed container and is contemplated for purposes of the various embodiments herein as being movable utilizing un-tethered, wireless remote control. In the illustrated embodiment the computer 54 (depicted as a laptop computer in the illustrated embodiment although other appropriate computing devices are also contemplated) is contemplated to be in wireless communication with the ROV 52. A motion control input device, such as a joystick 63 is connected to the computer 54 and allows for a technician to control movement of the device 52 inside the transformer 58. Such control can be by visual awareness of the technician and/or by information made available via the display 56 (such as, but not limited to, a virtual model of the transformer 58). Other types of motion control input devices, such as used in video games, handheld computer tablets, computer touch screens or the like may be employed.

In some embodiments the computer 54 can be connected to another computer via a network, such as the depicted internet 64 as one example, so as to allow for the images or sensor data to be transferred to experts, who may be remotely located, designated by the block 66 so that their input can be provided to the technician so as to determine the nature and extent of the condition within the transformer and then provide corrective action as needed. In some embodiments, control of the ROV can also be transferred to an expert, who may be remotely located. In such embodiments, the expert would have another computer that can send control signals via a network to the local computer 54 that in turn sends signals to control the device 52 as described above.

The transformer 58 may be configured with a plurality of signal transmitters and/or receivers 68 mounted on the upper corners, edges or other areas of the transformer 58, or in nearby proximity to the transformer. The transmitters and/or receivers 68 are structured to send and/or receive a wireless signal 61 from the inspection device to determine the position of the inspection device in the transformer tank.

The transmitters and/or receivers 68 can be a transceiver in one embodiment, but can include a transmitter and antenna that are separate and distinct from one another in other embodiments. For example, the transmitter can be structured to send information using different frequencies/modulation/protocols/etc than an antenna is structured to receive. Thus as used herein, the term "transmitter" and "antenna" can refer to constituent parts of a transceiver, as well as standalone components separate and apart from one another. No limitation is hereby intended unless explicitly understood to the contrary that the term "transmitter" and/or "antenna" are limited to stand alone components unless otherwise indicated to the contrary. Furthermore, no limitation is hereby intended that the use of the phrase "transmitters and/or receivers" must be limited to separate components unless otherwise indicated to the contrary.

Informational data gathered by the ROV 52, and any associated sensor, can be transmitted to the computer 54 through the fluid and the tank wall with the openings 62. Use of different communication paths for difference aspects of the operation of the ROV 52 may be used to prevent interference between the signals. Some embodiments may utilize the same communication path to transfer data related to positioning, data information, and control information as appropriate.

Figure 2:
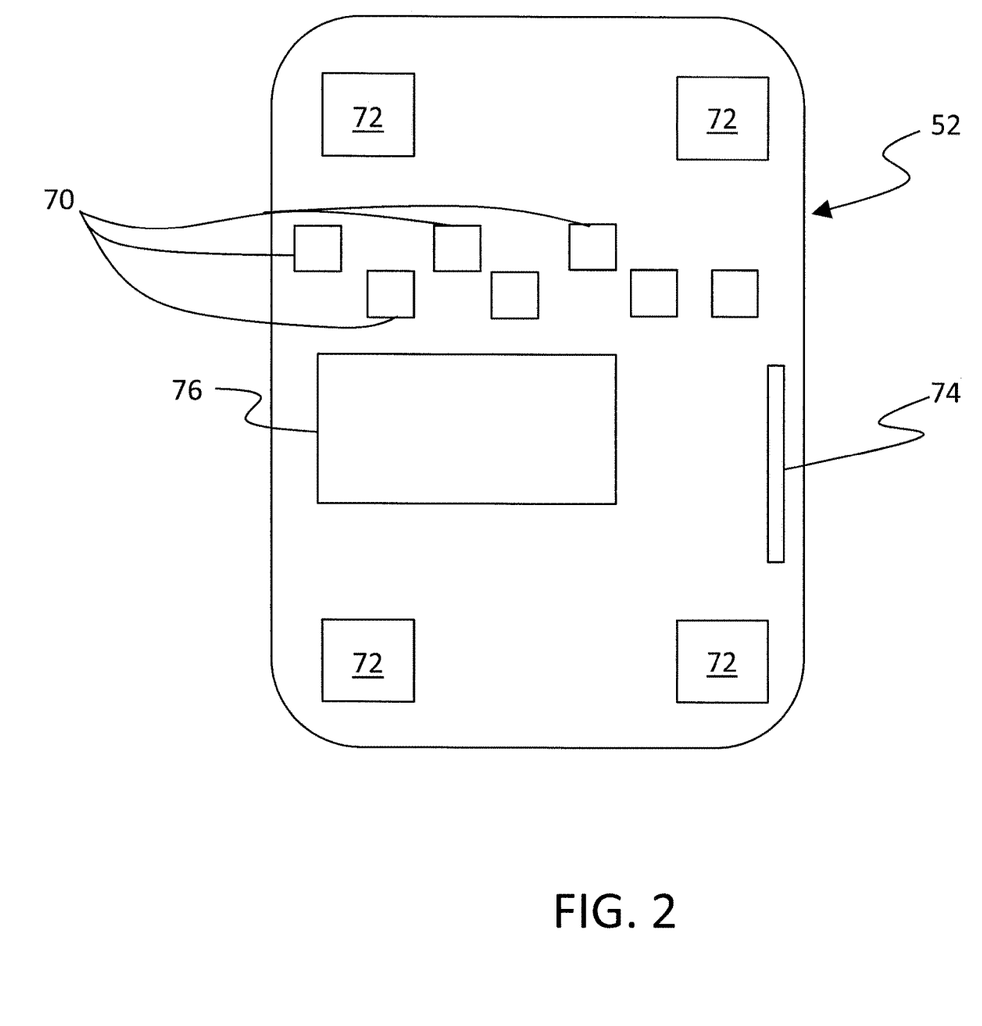
FIG. 2 depicts one embodiment of the submersible drone.

Turning now to FIG. 2, one embodiment of the ROV 52 is depicted as including cameras 70, motors 72 and transmitter and/or receiver 74. Other components may also be included in the ROV but are not illustrated for sake of brevity (e.g. a battery to provide power to the cameras, additional sensors such as rate gyros or magnetometers, etc). The cameras 70 are utilized to take visible and other wavelength images of the internal components of the transformer. In one embodiment of the ROV 52 a number of cameras are fixed in orientation and do not have separate mechanisms (e.g. a servo) two change their point of view. In other embodiments all cameras the ROV 52 have a fixed field of view and not otherwise capable of being moved. These images allow for technicians to monitor and inspect various components within the transformer. The cameras 70 can take on any variety of forms including still picture and moving picture cameras (e.g. video camera). Any number and distribution of the cameras 70 are contemplated. In one form ROV 52 can have an array of cameras 70 distributed in one region, but in other forms the cameras 70 can be located on all sides of the ROV 52. In some embodiments, the ROV 52 is provided with lights which facilitate illumination of the area surrounding the inspection device 52. In some embodiments the lights are light emitting diodes, but it will be appreciated that other illumination devices could be used. The illumination devices are oriented so as to illuminate the viewing area of one or more of the cameras 70. In some embodiments, the user can control the intensity and wavelength of the light.

The motors 72 are used to provide power to a propulsor (e.g. an impeller) which are used to control and/or provide propulsive power to the ROV 52. Each motor 72 can be reversible so as to control the flow of fluid or oil through the flow channels. Each motor can be operated independently of one another so as to control operation of an associated propulsor (e.g. a thruster pump) such that rotation of the pump in one direction causes the liquid to flow through the flow channel in a specified direction and thus assist in propelling ROV 52 in a desired direction. Other configurations of the propulsor are also contemplated beyond the form of a propeller mentioned above, such as a paddle-type pump which could alternatively and/or additionally be utilized. In some embodiments, a single motor may be used to generate a flow of fluid through more than one channel. In other words, a housing of the ROV 52 could provide just one inlet and two or more outlets. Valves maintained within the housing could be used to control and re-direct the internal flow of the fluid and, as a result, control movement of the ROV 52 within the tank. Fluid flow from the motor can also be diverted such as through use of a rudder, or other fluid directing device, to provide the steerage necessary to manipulate the vehicle. By coordinating operation of the motors with a controller, and thus the oil flowing through the housing of the ROV, the inspection device can traverse all areas of the transformer through which it can fit. Moreover, the ROV 52 is able to maintain an orientational stability while maneuvering in the tank. In other words, the ROV 52 can be stable such that it will not move end-over-end while moving within the transformer tank.

The transmitter and/or receiver 74 can be connected to a controller on board the ROV 52 for the purpose of transmitting data collected from the cameras 70 and also for sending and receiving control signals for controlling the motion and/or direction of the ROV 52 within the transformer. The transmitter and/or receiver 74 is structured to generate a wireless signal that can be detected by the computer or any intermediate device, such as through reception via the transmitter and/or receiver 68.

Other aspects of an exemplary remotely operated submersible which is operated in a fluid filled transformer tank described in FIG. 1 or 2 are described in international application publication WO 2014/120568, the contents of which are incorporated herein by reference.

Referring now to FIGS. 1 and 2, transmissions from either or both of the transmitters and/or receivers 68 and 74 can occur over a variety of manners, including various frequencies, powers, and protocols. In some applications the communication between the ROV 52 and the base station can be supplemented with a repeater or relay station, but not all embodiments need include such devices. The manners of transmission between 68 and 74 need not be identical in all embodiments. To set forth just a few examples, the transmitter and/or receiver 68 used for broadcast of signals from the base station can transmit in power that ranges from 1 W to 5 W. The base station can also transmit in frequencies that that range from about 300 MHz to about 5 GHz, and in some forms are at any of 300 MHz, 400 MHz, 433 MHz, 2.4 GHz, and 5 GHz. Transmission can occur using any variety of protocols/formats/modulation/etc. In one example, transmission from the base station can use digital radio communications such as that used for RC model cars/boats/airplanes/helicopters. The transmission can also occur as TCP/IP or UDP, it can occur over WiFi radios, serial communication over Bluetooth radios, etc. In one particular form, video transmissions can occur as streaming for a Wi-Fi camera over 2.4 GHz.

In much the same manner as the transmitter and/or receiver 68 of the base station, the transmitter and/or receiver of the ROV 52 can transmit in power that ranges from 250 mW to 3 W. The base station can also transmit in frequencies that that range from about 300 MHz to about 5 GHz, and in some forms are at any of 300 MHz, 400 MHz, 433 MHz, 2.4 GHz, and 5 GHz. Transmission can occur using any variety of protocols/formats/modulation/etc. In one example, transmission from the base station can use digital radio communications such as that used for RC model cars/boats/airplanes/helicopters. The transmission could be video over IP, and one embodiment of IP could be WiFi/WLAN. In one non-limiting embodiment the transmission can therefore occur as TCP/IP or UDP, it can occur over WiFi radios, serial communication over Bluetooth radios, etc. In one particular form, video transmissions can occur as streaming for a Wi-Fi camera over 4.2 GHz. IN short, a variety of transmission techniques/approaches/protocols/frequencies/etc are contemplated herein.

Figure 3:
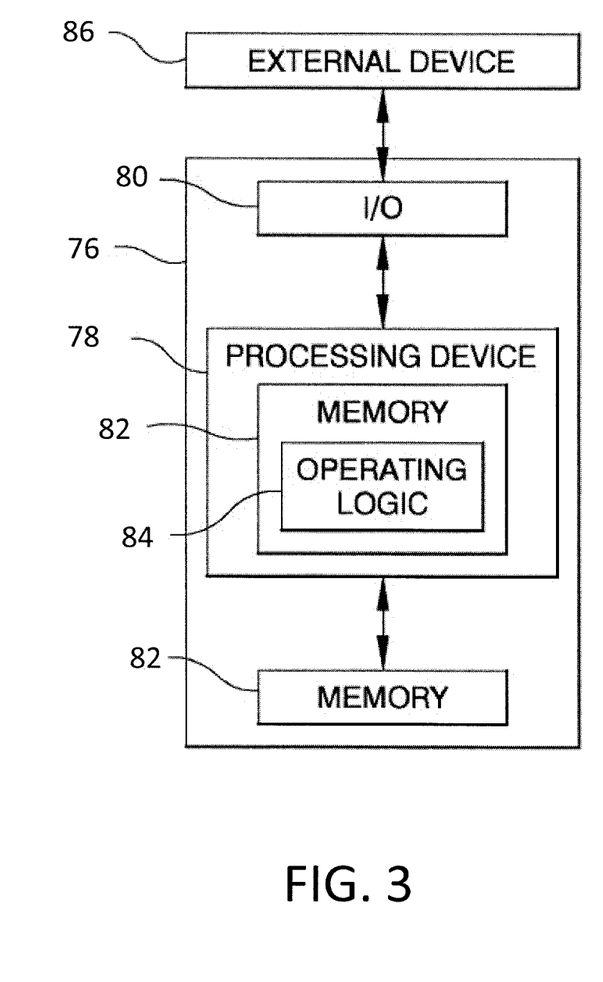
FIG. 3 depicts an embodiment of computer used with either or both the submersible drone or base station.

The ROV 52 can include an onboard computer 76 which can be used either in conjunction with, or in place of, the computer 54 at the base station for operating upon images from the cameras 70 to inspect the tank, build a model of components in the tank, etc. Either or both of computer 54 and 76 can include a processing device 78, an input/output device 80, memory 82, and operating logic 84. Furthermore, computer 76 communicates with one or more external devices 86.

The input/output device 80 may be any type of device that allows the computer 76 to communicate with the external device 86, whether through wired or wireless connection (e.g. via transmitter and/or receivers). To set forth just one nonlimiting example, the input/output device may be a firmware radio receiver, network adapter, network card, or a port (e.g., a USB port, serial port, parallel port, VGA, DVI, HDMI, FireWire, CAT 5, or any other type of port). The input/output device 80 may be comprised of hardware, software, and/or firmware. It is contemplated that the input/output device 80 can include more than one of these adapters, cards, or ports.

The external device 86 may be any type of device that allows data to be sent to, inputted or outputted, communicated from, etc the computer 76. For example, the external device 86 may be another computer, a server, a printer, a display, an alarm, an illuminated indicator, a keyboard, a mouse, mouse button, or a touch screen display. The external device can also include any number of separate components such as a computer working in conjunction with a transmitter. It is further contemplated that there may be more than one external device in communication with the computer 76.

Processing device 78 can be of a programmable type, a dedicated, hardwired state machine, or a combination of these; and can further include multiple processors, Arithmetic-Logic Units (ALUs), Central Processing Units (CPUs), or the like. For forms of processing device 78 with multiple processing units, distributed, pipelined, and/or parallel processing can be utilized as appropriate. Processing device 78 may be dedicated to performance of just the operations described herein or may be utilized in one or more additional applications. In the depicted form, processing device 78 is of a programmable variety that executes algorithms and processes data in accordance with operating logic 84 as defined by programming instructions (such as software or firmware) stored in memory 82. Alternatively or additionally, operating logic 84 for processing device 78 is at least partially defined by hardwired logic or other hardware. Processing device 78 can be comprised of one or more components of any type suitable to process the signals received from input/output device 80 or elsewhere, and provide desired output signals. Such components may include digital circuitry, analog circuitry, or a combination of both.

Memory 82 may be of one or more types, such as a solid-state variety, electromagnetic variety, optical variety, or a combination of these forms. Furthermore, memory 82 can be volatile, nonvolatile, or a mixture of these types, and some or all of memory 82 can be of a portable variety, such as a disk, tape, memory stick, cartridge, or the like. In addition, memory 82 can store data that is manipulated by the operating logic 84 of processing device 78, such as data representative of signals received from and/or sent to input/output device 80 in addition to or in lieu of storing programming instructions defining operating logic 84, just to name one example. As shown in FIG. 3, memory 82 may be included with processing device 78 and/or coupled to the processing device 78.

Figure 4:
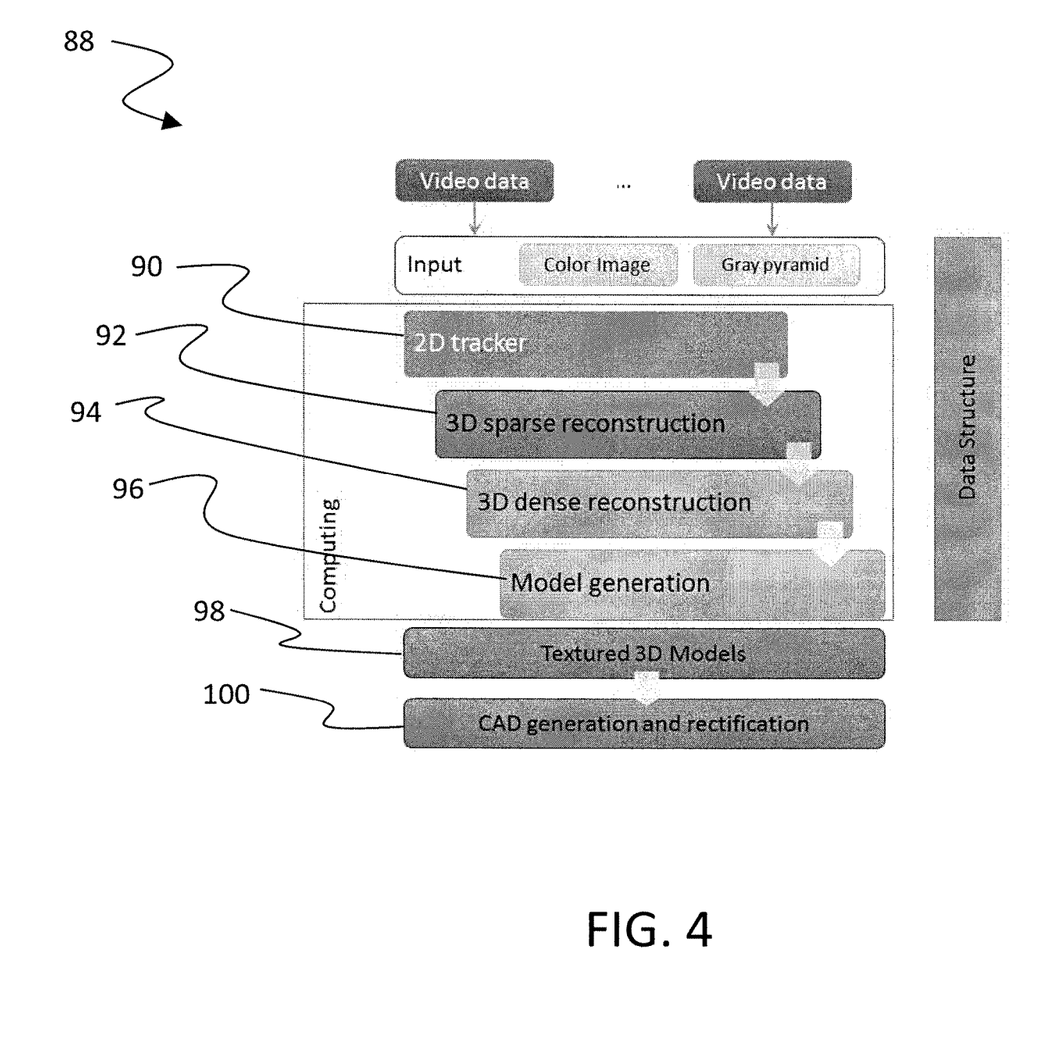
FIG. 4 depicts an embodiment of a vision based modeling system used with the submersible drone.

Information from the ROV 52 such as camera images, inertial sensor data onboard the ROV 52 (e.g. from accelerometers and/or an IMU package) can be used in a vision based modelling system useful to create a model of the interior of the tank 58 for further inspection. A vision based modelling system 88 is shown in FIG. 4 and is described further below. The vision based modelling system includes modules such as algorithmic modules useful to produce high-quality vison-based dense 3D transformer modelling and 3D transformer model rectification if available.

The array of N-cameras 70 (described above) can be used to browse inside of the tank 58, which in some cases can include interactively browsing. The cameras 70 can be fixed in some embodiments as will be appreciated. As a result of the browsing a dense texture-mapped scene model can be generated in real-time using the techniques described herein.

Each respective 3D model that corresponds to each camera can be composed of depth maps built from bundles of frames by dense and sub-pixel accurate multi-view stereo reconstruction.

Photometric information can be collected sequentially and separately for each camera in a form of cost volume, and incrementally solved for regularized depth maps via a non-convex optimization and Newton method to achieve fine accuracy.

A correspondent cost volume of each camera can be fused in a single voxel. This process can require the use of the onboard telemetry of the ROV 52 and the information of the camera location with respect of each other in order to compute a global alignment into the voxel so the optimized contribution from each cost volume can be connected in a global coordinate system. This process is useful when rectifying the anomalies coming from the oil environment.

By using the onboard telemetry the 3D model has a real scale and can be registered to a CAD model if one exists in order to increase the accuracy of the reconstruction. This registration requires the use of the CAD or analogous model as a generator of a point cloud. Since CAD models have very few 3D points compared with dense point clouds the techniques described herein utilize a ray tracing algorithm with an average of 300 virtual cameras in order to generate a point cloud from the CAD model.

The 3D modelling approach (FIG. 4) takes advantage of the slow motion of the 6DOF inspection robot due to the oil environment in which is submerged, where thousands of narrow-baseline video frames from multiple cameras are the input to each depth map and then a global 3D reconstruction is constructed.

The approach described herein uses multi-video and telemetry data that is coming from the ROV 52 (e.g. a 6DOF tank inspection robot such as a transformer inspection robot) and it is able to reconstruct the transformer in quasi-real-time and keeps updating and optimizing the interior of the transformer while the robot is navigating. Described herein are: (1) a distributed reconstruction pipeline which exploits the individual capabilities and requirements of the system components; obtainment of dense reconstructions on-the-fly, with real-time processing; and (3) an interface which allows the operator to interact with the reconstruction process and create annotations.

Turning now to the 2D tracker module 90 depicted in FIG. 4, images are transmitted uncompressed and in full-resolution from the ROV 52 (e.g. submergible inspection robot). Transmitting images in this fashion can allow detection of the same features as the 2D tracker and the sparse reconstruction later in the dense reconstruction. New map points can be added by triangulation with neighboring views and refined by local bundle adjustment algorithm per camera.

The tracking part of the vision based modelling system can run on the ground station and has two important tasks: it delivers pose estimates for the input frames (every input frame in some embodiments) and it selects image frames based on the scene coverage of the map.

A 3D sparse reconstruction module 92 is also depicted in FIG. 4 in which global bundle adjustment with telemetry integration is applied whenever the reconstruction is idle or active. Bundle adjustment (BA) can be applied in a distributed manner in each camera in order to generate sparse maps from each source.

The system 88 described herein can employ a very simple inter-frame rotation estimator to aid tracking when the camera is panning (either by virtue of movement of the ROV 52 or movement of the camera, in which case measurement of the camera position can be taken); generating an image re-localization approach supported by accelerometers and IMU data (if available) for under-oil usage. The accelerometers/IMU pose of the ROV 52 can be stored and inserted into related image frames (e.g. all further image frames) relative to that in order to reduce uncertainties. As a result, the approach disclosed herein can re-localize in complex tank scenes with repetitive features and, therefore, generate a reliable 3D sparse reconstruction.

A 3D dense reconstruction module 94 is depicted in FIG. 4 and utilizes information from the 3D sparse reconstruction module 92 generated in the previous step to help in the generation of a live dense volumetric reconstructions based on several camera inputs from the ROV 52. The distributed reconstruction is based on variational depth map fusion.

Quasi-dense depth-maps can be computed based on the image frames stored by the sparse reconstruction using a GPGPU-accelerated multi-view whole image registration algorithm. Image frames might exhibit different lighting conditions, therefore normalized cross correlation can be used as robust similarity measure for photometrical information and to avoid coarse-to-fine warping.

A volumetric representation of geometry using a truncated signed distance function can be employed herein. In contrast to mesh based representations, volumetric approaches allow solving for arbitrary 3D geometry. After individual depth maps are fused together, a globally optimal primal-dual approach for regularization applied in the point cloud instead of the mesh can be used.

A model generation module 96 is also depicted in the process of FIG. 4. A transformer model (e.g. CAD) can be generated by converting the point cloud produced from the 3D dense reconstruction module 94 into a mesh. The process works by maintaining a list of points from which the mesh can be grown and extending it until all possible points are connected. The process can deal with unorganized points, coming from one or multiple scans, and having multiple connected parts. The process may work best if the surface is locally smooth and there are smooth transitions between areas with different point densities. The smooth surfaces are achieved in the previous step by regularizing the point cloud before converting to a mesh.

Triangulation can be performed locally, by projecting the local neighborhood of a point along the point's normal, and connecting unconnected points. Results can be visualized in real-time on a ground station interface, which gives the user the opportunity to interact.

Turning now to the textured-annotated 3D transformer modelling module 98 also depicted in FIG. 4. This module includes an interactive process where textures and annotation can be introduced in to the model in order to introduce augmented information to the model. Information from the model generation module 96 is provided to this step with a high-quality transformer model, then information about relevant features can be added on-the-fly while the ROV 52 is performing an inspection task, highlighting anomalies or elements that require additional off-line analysis.

A CAD generation and rectification module 100 is depicted in FIG. 4. In some cases, objects within the tank 58, such as but not limited to transformer components, have associated CAD models from manufacture. In these cases the system 88 can use the original CAD models as a ground truth to rectify the transformer model generated on-the-fly. This process can be performed in real-time, and iteratively optimized while the inspection is performed. The same rectification is performed if a valid transformer model is available from a previous inspection using this method.

Such rectification techniques can compare common points between the stored version (e.g. CAD model) and the mesh version (determined using the techniques herein).

If the model generation was performed without telemetry the model is up to scale factor, then the previous model is used for global alignment and rectification bringing the generated model to real-scale.

Any one or more of the modules described herein can be performed on a single computer, but some embodiments of the system 88 can be distributed over many separate computers.

One aspect of the present application includes a method comprising viewing an object with a plurality of cameras on a submersible immersed in a liquid to form a series of images, estimating a pose of an object in the images, performing a bundle adjustment on features of the object in the images, computing depth-maps based on the series of images to form a 3D dense reconstruction, creating a point cloud upon fusing individual depth-maps from the computing depth-maps, converting the point cloud to a mesh to form a model, and rectifying the model with pre-existing data of the object.

A feature of the present application includes wherein the viewing the object is performed beneath the surface of a liquid.

Another feature of the present application further includes recording a pose orientation of the submersible along with images taken at the pose orientation.

Still another feature of the present application includes wherein the rectifying is performed with a CAD model.

Yet another feature of the present application includes wherein the rectifying is performed with a model of the object from a prior inspection that included the viewing, estimating, performing, computing, creating, and converting.

Still yet another feature of the present application further includes introducing at least one of a texture and an annotation to the model.

Yet still another feature of the present application includes wherein the bundle adjustment is performed in each camera to generate sparse maps from each camera.

A further feature of the present application includes wherein the converting also includes projecting a local neighborhood of a point along the point's normal, and connecting unconnected points.

A still further feature of the present application includes wherein the converting is performed without telemetry.

Another aspect of the present application includes an apparatus comprising a vision based modelling system for generating a model of a submerged object of interest located in a working liquid, the vision based modelling system structured to: capture a set of images from a plurality of cameras mounted on a submersible vehicle, estimate a pose of an object in the set of images, perform a bundle adjustment on features of the object in the images, create a point cloud upon fusing individual depth-maps based from the set of images, convert the point cloud to a mesh to form a model, and rectify the model with pre-existing data of the object.

A feature of the present application includes wherein the vision based modelling system structured to compute depth-maps based on the series of images to form a 3D dense reconstruction.

Another feature of the present application further includes a computer having a computer readable memory, the vision based modelling system expressed as a programming instruction and stored in the computer readable memory.

Still another feature of the present application includes wherein the vision based modelling system is hosted in a distributed computing environment having at least two computers.

Yet another feature of the present application includes wherein the pre-existing data is a prior model of the object from a previous inspection that produced the prior model using the vision based modelling system.

Still yet another feature of the present application includes wherein the vision based modelling system is further structured to introduce at least one of a texture and an annotation to the model, and wherein the bundle adjustment is performed on images from each camera to generate sparse maps of the images from each camera.

Yet still another feature of the present application includes wherein the vision based modelling system is further structured to project a local neighborhood of a point along the point's normal, and connecting unconnected points; and which further includes a submersible vehicle having a plurality of cameras, and wherein the vision based modelling system is further structured to store a pose orientation of the submersible vehicle with image frames taken at the pose orientation.

Still another aspect of the present application includes an apparatus comprising: a first computer structured to receive images of an object as viewed through a liquid from a plurality of cameras on board a submersible vehicle, and a vision based modelling system configured to execute a 2D tracker module, a 3D sparse reconstruction module that utilizes bundle adjustment, a 3D dense reconstruction module to provide a point cloud, a model generation module which converts the point cloud to a mesh, and an image rectification module utilizing stored information about the object to rectify images taken in a liquid medium with the stored information about the object, wherein the first computer is structured to execute at least one of the 2D tracker module, 3D sparse reconstruction module, 3D dense reconstruction module, model generation module, and image rectification module.

A feature of the present application further includes a tank containing a liquid, and a submersible vehicle that includes the plurality of cameras.

Another feature of the present application includes wherein the 2D tracker module includes the ability to determine a pose estimate of the object.

Still another feature of the present application includes wherein the 3D spare reconstruction module includes a routine to perform a global bundle adjustment with telemetry integration.

Yet another feature of the present application includes wherein the 3D dense reconstruction includes a routine to determine depth-maps using information from the 3D spare reconstruction.

Still yet another feature of the present application includes wherein the model generation module uses a point cloud developed from the 3D dense reconstruction module and converts the point cloud to a mesh.

Yet still another feature of the present application includes wherein the image rectification module uses a prior model to compare a vision based model created from the model generation module.

A further feature of the present application includes wherein the prior model is a CAD model or a prior vision based model formed from the vision based modelling system.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as "a," "an," "at least one," or "at least one portion" are used there is no intention to limit the claim to only one item unless specifically stated to the contrary in the claim. When the language "at least a portion" and/or "a portion" is used the item can include a portion and/or the entire item unless specifically stated to the contrary. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

What is claimed is:

1. A method performed by a processing device, the method comprising:
   viewing an object with a plurality of cameras on a submersible immersed in a liquid to form a first series of images;
   estimating a pose of the object in the first series of images;
   performing a bundle adjustment on features of the object in the first series of images;
   computing depth-maps based on the first series of images and the bundle adjustment to form a 3D dense reconstruction;
   creating a point cloud based upon fusing individual depth-maps from the depth-maps of the 3D dense reconstruction;
   converting the point cloud to a mesh to form a model;
   rectifying the model with pre-existing data of the object, the pre-existing data of the object including a prior model of the object from a prior inspection by the submersible that included prior viewing of the object to form a second series of images, estimating of the pose in the second series of images, performing of the bundle adjustment, computing of the depth-maps, creating of the point cloud, and converting of the point cloud to the mesh to form the prior model of the object from the prior inspection; and
   outputting the model for display.

2. The method of claim 1, wherein the viewing the object is performed beneath a surface of the liquid.

3. The method of claim 1, which further includes recording a pose orientation of the submersible along with images taken at the pose orientation.

4. The method of claim 1, wherein the rectifying of the model with pre-existing data of the model is performed with a CAD model.

5. The method of claim 1, which further includes introducing at least one of a texture and an annotation to the model.

6. The method of claim 1, wherein the bundle adjustment is performed in each camera to generate sparse maps from each camera.

7. The method of claim 1, wherein the converting also includes projecting a local neighborhood of a point along the point's normal, and connecting unconnected points.

8. The method of claim 1, wherein the converting is performed without telemetry.

9. An apparatus comprising:
   a vision based modelling system for generating a model of a submerged object of interest located in a working liquid, the vision based modelling system structured to:
   capture a set of images from a plurality of cameras mounted on a submersible vehicle, the set of images comprising a first plurality of images;
   estimate a pose of an object in the set of images;
   perform a bundle adjustment on features of the object in the set of images;
   create a point cloud upon fusing individual depth-maps based from the set of images and the bundle adjustment;
   convert the point cloud to a mesh to form a model;
   rectify the model with pre-existing data of the object, the pre-existing data comprising a prior model of the object from a previous inspection that produced the prior model using the vision based modelling system that includes the capture of a set of images comprising a second plurality of images, estimate of the pose, perform of the bundle adjustment, create of the point cloud, and convert of the point cloud to the mesh to form the prior model of the object; and
   output the model for display.

10. The apparatus of claim 9, wherein the vision based modelling system structured to compute depth-maps based on the set of images to form a 3D dense reconstruction.

11. The apparatus of claim 9, which further includes a computer having a non-transitory computer readable memory, the vision based modelling system expressed as a programming instruction and stored in the non-transitory computer readable memory.

12. The apparatus of claim 9, wherein the vision based modelling system is hosted in a distributed computing environment having at least two computers.

13. The apparatus of claim 9, wherein the vision based modelling system is further structured to introduce at least one of a texture and an annotation to the model, and wherein the bundle adjustment is performed on images from each camera to generate sparse maps of the images from each camera.

14. The apparatus of claim 9, wherein the vision based modelling system is further structured to project a local neighborhood of a point along the point's normal, and connecting unconnected points; and which further includes a submersible vehicle having a plurality of cameras, and wherein the vision based modelling system is further structured to store a pose orientation of the submersible vehicle with image frames taken at the pose orientation.

15. An apparatus comprising:
   a first computer comprising a processing device and a memory, the first computer structured to receive a first plurality of images of an object as viewed through a liquid from a plurality of cameras on board a submersible vehicle and to execute a vision based modelling system; and
   the vision based modelling system configured to execute instructions to: determine a pose estimate of the object, utilize bundle adjustment, provide a point cloud, convert the point cloud to a mesh to form a vision based model, and utilize stored information about the object to rectify the vision based model with the stored information about the object, the stored information comprising a prior model created using the first computer to receive a second plurality of images from the plurality of cameras and execute the vision based modelling system to determine the pose estimate, utilize the bundle adjustment, provide the point cloud, and convert the point cloud to the mesh to form the prior model, a vision based model created from the model generation module, and the first computer further configured to execute at least one of the 2D tracker module, 3D sparse reconstruction module, 3D dense reconstruction module, model generation module, and image rectification module.

16. The apparatus of claim 15, wherein the liquid is comprised in a tank, the apparatus further comprising a submersible vehicle that includes the plurality of cameras.

17. The apparatus of claim 15, wherein the instructions that utilize bundle adjustment perform a global bundle adjustment with telemetry integration.

18. The apparatus of claim 15, wherein the instructions that provide the point cloud further determine depth-maps using information from the bundle adjustment.

19. The apparatus of claim 15, wherein the prior model is a CAD model or a prior vision based model formed from the vision based modelling system.

* * * * *